(12) United States Patent
Ji et al.

(10) Patent No.: US 12,538,546 B2
(45) Date of Patent: Jan. 27, 2026

(54) SEMICONDUCTOR STRUCTURE AND FORMING METHOD THEREOF

(71) Applicant: Semiconductor Manufacturing International (Shanghai) Corporation, Shanghai (CN)

(72) Inventors: Shiliang Ji, Shanghai (CN); Zhenyang Zhao, Shanghai (CN); Cheng Tan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 403 days.

(21) Appl. No.: 18/137,767

(22) Filed: Apr. 21, 2023

(65) Prior Publication Data

US 2023/0343852 A1 Oct. 26, 2023

(30) Foreign Application Priority Data

Apr. 24, 2022 (CN) .......................... 202210453248.8

(51) Int. Cl.
*H01L 29/66* (2006.01)
*H01L 29/06* (2006.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/018; H10D 64/021; H10D 84/013; H10D 84/0158; H10D 84/017; H10D 84/0193; H10D 84/834; H10D 84/853
See application file for complete search history.

(56) References Cited

U.S. PATENT DOCUMENTS

2023/0010657 A1* 1/2023 Wu ..................... H10D 30/014
2023/0051602 A1* 2/2023 Park ..................... H10D 62/121
(Continued)

*Primary Examiner* — David C Spalla
(74) *Attorney, Agent, or Firm* — Anova Law Group, PLLC (57) ABSTRACT

A semiconductor structure includes: a substrate; channel structures on the substrate, a channel structure of the channel structures including a plurality of channel layers stacked along a direction perpendicular to a surface of the substrate and a plurality of gate grooves between adjacent channel layers; gate structures spanning the channel structure, the gate structures being also in the plurality of gate grooves; source/drain regions on the substrate on two sides of the gates and the channel layers, the source/drain regions being in contact with sidewalls of a plurality of channel layers; and inner spacer layers between adjacent channel layers, and first dielectric layers between the inner spacer layers and the gate structures, the inner spacer layers being between the source/drain regions and the gate structures.

20 Claims, 8 Drawing Sheets

(51) Int. Cl.
*H01L 29/423* (2006.01)
*H01L 29/775* (2006.01)
*H10D 30/01* (2025.01)
*H10D 30/43* (2025.01)
*H10D 30/67* (2025.01)
*H10D 62/10* (2025.01)
*H10D 64/01* (2025.01)

(52) U.S. Cl.
CPC ..... *H10D 30/6735* (2025.01); *H10D 30/6757* (2025.01); *H10D 62/121* (2025.01); *H10D 64/018* (2025.01)

(56) References Cited

U.S. PATENT DOCUMENTS

2023/0066230 A1* 3/2023 Peng .................... H10D 30/031
2023/0080922 A1* 3/2023 Yao ................... H01L 21/28123
257/347

* cited by examiner

SEMICONDUCTOR STRUCTURE AND FORMING METHOD THEREOF

CROSS-REFERENCE TO RELATED APPLICATION

This application claims priority of Chinese Patent Application No. 202210453248.8, filed on Apr. 24, 2022, the entire contents of which are hereby incorporated by reference.

FIELD OF THE DISCLOSURE

The present disclosure generally relates to the field of semiconductor technology and, more particularly, relates to a semiconductor structure and a forming method thereof.

BACKGROUND

With an increasing integration degree of an integrated circuit, a size of an integrated circuit device is getting smaller and smaller. In recent years, transistor structures represented by stacked nanosheet FETs have been applied in various semiconductor devices. A stacked nanosheet field-effect transistor is composed of a plurality of nanoscale sheets stacked on top of each other to enable metal gates to surround channel regions, thereby better reducing leakage and controlling current to provide a device with better performance and lower power consumption.

In the stacked nanosheet field effect transistor, since the metal gates completely surround the channel regions, there are inner spacers between sidewalls of the metal gates and source/drain regions to isolate the metal gates from the source/drain regions.

In addition, in the stacked nanosheet field effect transistor, there are high-K dielectric layers between the metal gates and the inner spacers. However, in the existing technologies, the high-K dielectric layers on surfaces of the inner spacer are usually thick, which leads to increased parasitic capacitances and a degraded device performance.

BRIEF SUMMARY OF THE DISCLOSURE

One aspect of the present disclosure provides a semiconductor structure. The semiconductor structure includes: a substrate; channel structures on the substrate, a channel structure of the channel structures including a plurality of channel layers stacked along a direction perpendicular to a surface of the substrate and a plurality of gate grooves between adjacent channel layers; gate structures spanning the channel structure, the gate structures being also in the plurality of gate grooves, the gate structures surrounding the plurality of channel layers, and a gate structure of the gate structures including a gate and a gate dielectric layer on a surface of the gate; source/drain regions on the substrate on two sides of the gates and the channel layers, the source/drain regions being in contact with sidewalls of a plurality of channel layers; and inner spacer layers between adjacent channel layers, and first dielectric layers between the inner spacer layers and the gate structures, the inner spacer layers being between the source/drain regions and the gate structures, and a dielectric constant of a material of the first dielectric layers is lower than a dielectric constant of a material of the gate dielectric layers.

Another aspect of the present disclosure provides a forming method of a semiconductor structure. The forming method includes: providing a substrate; forming on the substrate initial channel structures, a dummy gate spanning the initial channel structures, source/drain regions on two sides of the dummy gate, and inner spacer layers, an initial channel structure of the initial channel structures including a plurality of channel layers stacked along a direction perpendicular to a surface of the substrate and a plurality of sacrificial layers between adjacent channel layers, and the inner spacer layers being between the sacrificial layers and the source/drain regions; forming isolation dielectric layers surrounding the dummy gate and the source/drain regions: removing the dummy gate, forming gate openings on the isolation dielectric layers; removing the sacrificial layers exposed by the gate openings, forming gate grooves between adjacent channel layers, the gate grooves exposing the inner spacer layers; forming first dielectric layers on surfaces of the inner spacer layers exposed by the gate grooves;

and forming gate structures in the gate grooves and the gate openings after forming the first dielectric layers, a gate structure of the gate structures including a gate and a gate dielectric layer on a surface of a gate, and a dielectric constant of a material of the first dielectric layers being lower than a dielectric constant of a material of the gate dielectric layers.

Other aspects of the present disclosure can be understood by a person skilled in the art in light of the description, the claims, and the drawings of the present disclosure.

DETAILED DESCRIPTION

As described above, high-K dielectric layers on surfaces of inner spacers are usually thick, which leads to increased parasitic capacitances and a degraded device performance.

Figure 1:
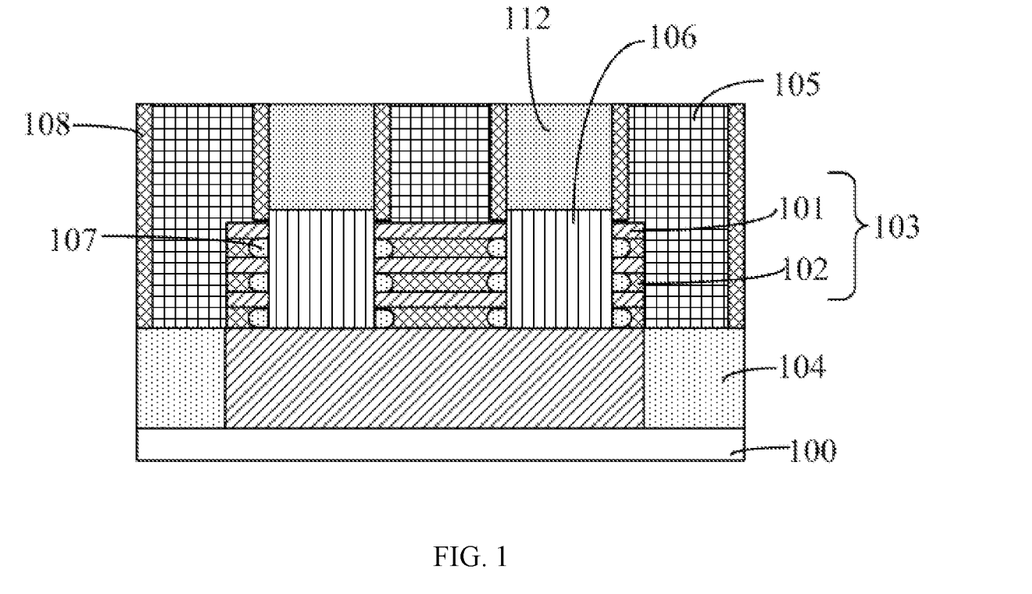
FIGS. 1-3 illustrate cross-sectional views of a semiconductor structure during a formation process.
Figure 2:
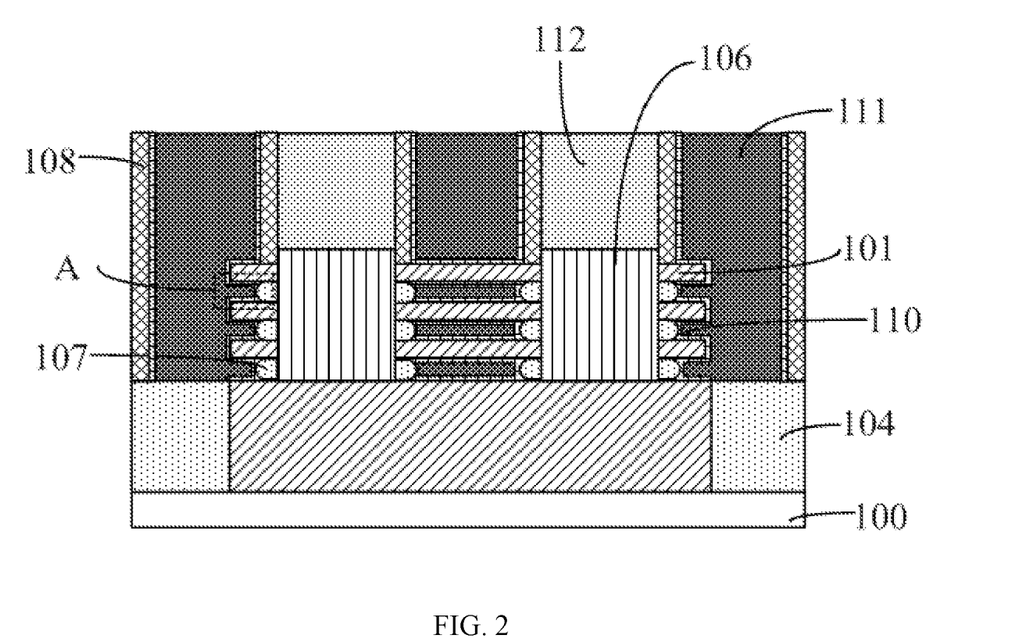
Figure 3:
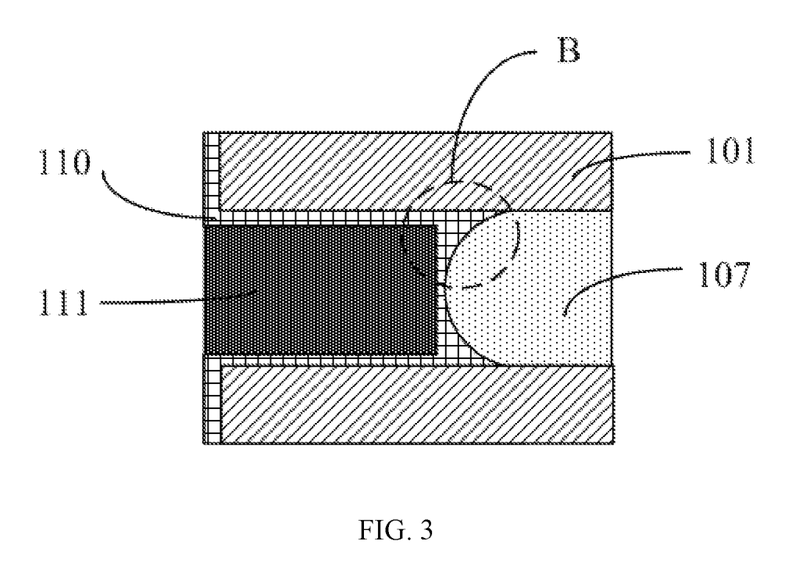

FIGS. 1-3 illustrate cross-sectional views of a semiconductor structure during a formation process.

Referring to FIG. 1, forming a semiconductor includes: providing a substrate 100; forming on the substrate 100 initial channel structures 103, a dummy gate 105 spanning the initial channel structures 103, source/drain regions 106 on two sides of the dummy gate 105, and inner spacer layers 107, an initial channel structure 103 including a plurality of channel layers 101 stacked along a direction perpendicular to a surface of the substrate 100 and a plurality of sacrificial layers 102 between adjacent channel layers 101, and the inner spacer layers 107 being between the sacrificial layers 102 and the source/drain regions 106; and forming isolation dielectric layers 112 surrounding the dummy gate 105 and the source/drain regions 106.

Forming the inner spacer layers 107 and the source/drain regions 106 includes: removing the initial channel structures 103 on two sides of the dummy gate 105 to form a source/drain gap; etching the sacrificial layers 102 on sidewalls of the source/drain gap to form initial grooves; forming inner spacer layers 107 in the initial grooves; and forming the source/drain regions 106 in the source/drain gaps.

In a process of etching the sacrificial layers 102, the farther a distance from a sidewall of a source/drain gap on a sacrificial layer 102 is, the lower an etching rate of the sacrificial layer 102 is. Therefore, after an etching is completed, surfaces of the initial grooves protrude into the sacrificial layers 102, so that the inner spacer layers 107 formed subsequently in the initial grooves also protrude into the sacrificial layers 102.

The method of forming the semiconductor structure further includes forming side frames 108 on a surface of the dummy gate 105 and isolation structures 104 on the substrate 100.

FIG. 3 illustrates a partial enlarged view of area A in FIG. 2.

The method of forming the semiconductor structure further includes: removing the dummy gate 105, and forming gate openings (not shown) on the isolation dielectric layers 112; removing the sacrificial layers 102, forming gate grooves between adjacent channel layers 101, and the gate grooves exposing the inner spacer layers 107; and forming gate structures in the gate grooves and the gate openings, a gate structure including a gate 111 and a gate dielectric layer 110, and a material of gate dielectric layers 110 being a high-K material.

Referring to FIG. 3, since a surface of an inner spacer layer 107 protrudes into a gate groove, there is a gap at a corner B formed by a surface of the inner spacer layer 107 and a surface of a channel layer 101. Therefore, in a process of forming gate dielectric layers 110 on surfaces of the inner spacer layers 107 and the channel layers 101, the gaps at the corner B are easily filled, resulting in more gate dielectric layers 110 in regions between the inner spacer layers 107, the channel layers 101 and the gates 111. At a same time, since s material of the gate dielectric layers 110 is a high-K material, parasitic capacitances between the source/drain regions 106 and the gates 111 increase, resulting in a degraded device performance.

To solve the above technical problem, a technical solution of the present disclosure provides a method of forming a semiconductor structure. By forming first dielectric layers on surfaces of the inner spacer layers, a dielectric constant of a material of the first dielectric layers is lower than a dielectric constant of a material of the gate dielectric layers, thereby reducing a proportion of the gate dielectric layers in regions between the inner spacer layers, the channel layers, and the gates, reducing the parasitic capacitances between the source/drain regions and the gates, and improving a device performance.

To make the above objects, features and beneficial effects of the present disclosure more comprehensible, specific embodiments of the present disclosure are described in detail below in conjunction with accompanying drawings.

Figure 4:
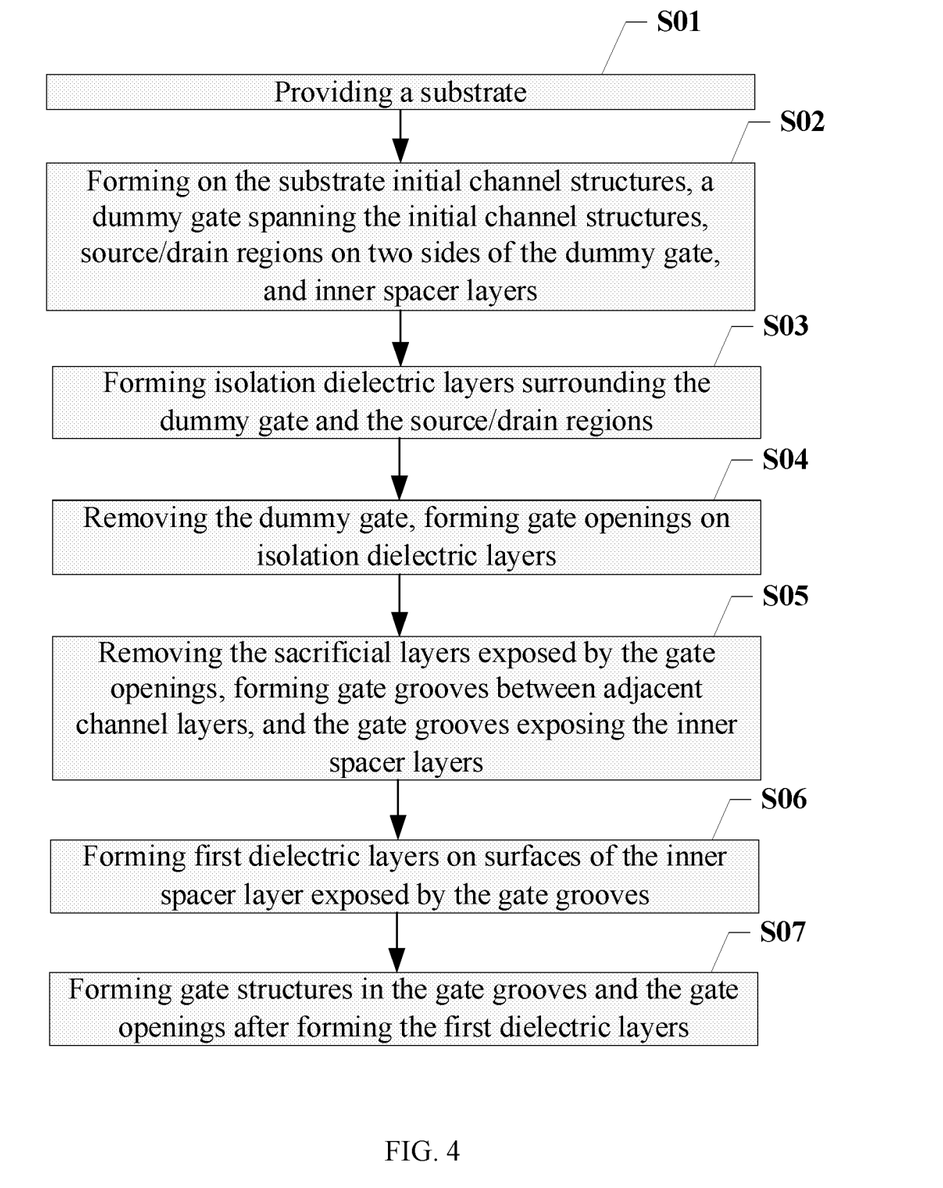
FIG. 4 illustrates a flow chart of a method of forming a semiconductor structure consistent with various embodiments of the present disclosure.

FIG. 4 illustrates a flow chart of a method of forming a semiconductor structure consistent with various embodiments of the present disclosure. FIGS. 5-14 illustrate schematic diagrams of a semiconductor structure consistent with various embodiments of the present disclosure.

Figure 5:
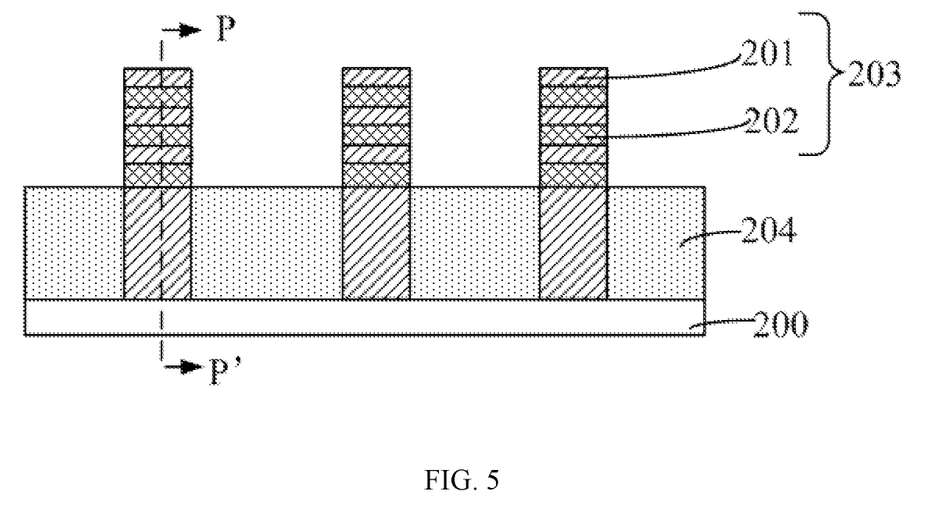
FIGS. 5-14 illustrate schematic diagrams of a semiconductor structure at various stages during a formation process consistent with various embodiments of the present disclosure.
Figure 6:
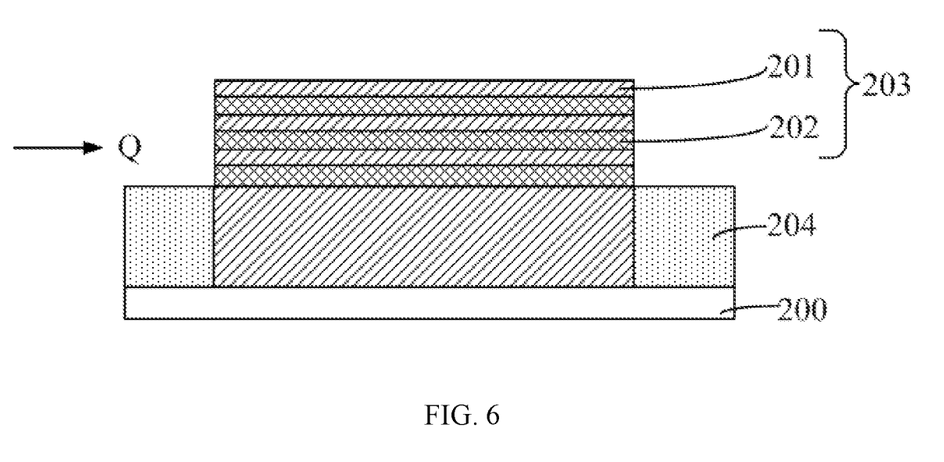

FIG. 5 illustrates a side view of FIG. 6 along a Q direction, and FIG. 6 illustrates a cross-sectional view of FIG. 5 along a PP' direction. In one embodiment, forming a semiconductor structure includes: providing a substrate 200; and forming initial channel structures 203 on the substrate 200.

A material of the substrate 200 includes silicon, silicon germanium, silicon carbide, silicon on insulator (SOI), germanium on insulator (GOI) and the like. Specifically, in one embodiment, the material of the substrate 200 is silicon.

In one embodiment, an initial channel structure 203 includes a plurality of channel layers 201 stacked along a direction perpendicular to a surface of the substrate 200 and a plurality of sacrificial layers 202 between adjacent channel layers 201.

A material of the channel layers 201 is different from a material of the sacrificial layers 202. Specifically, the material of the channel layers 201 includes silicon and the material of the sacrificial layers 202 includes silicon germanium.

The method of forming the semiconductor structure further includes forming isolation structures 204 on two sides of the initial channel structures 203.

Figure 7:
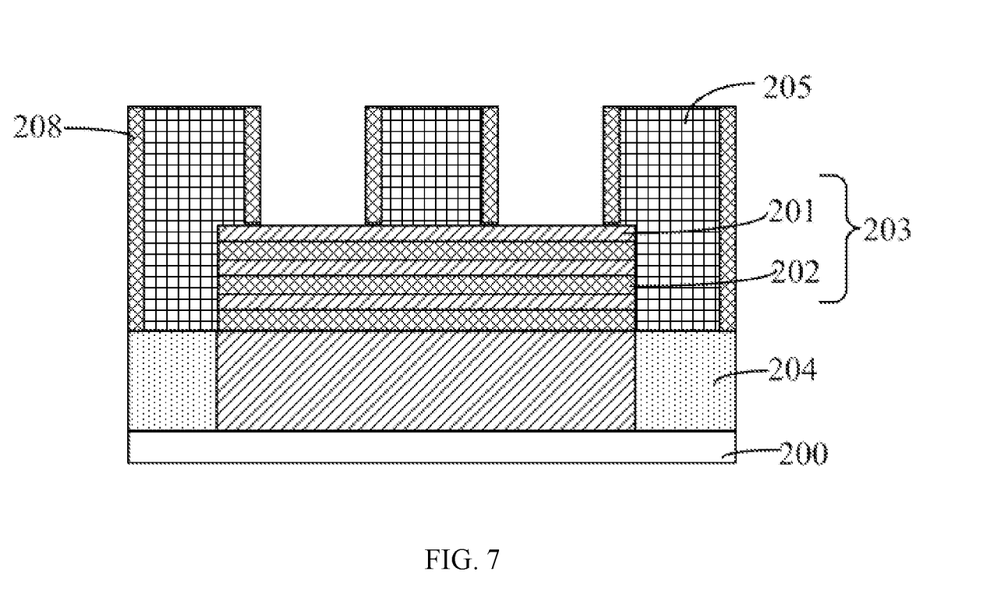

Referring to FIG. 7, the method of forming the semiconductor structure further includes forming a dummy gate 205 spanning the initial channel structures 203 and side frames 208 on sidewalls of the dummy gate 205 on the substrate 200.

The side frames 208 are configured to position source/drain regions to be formed in subsequence. In addition, the side frames 208 are also configured to isolate the source/drain regions and gates to be formed in subsequence.

Figure 8:
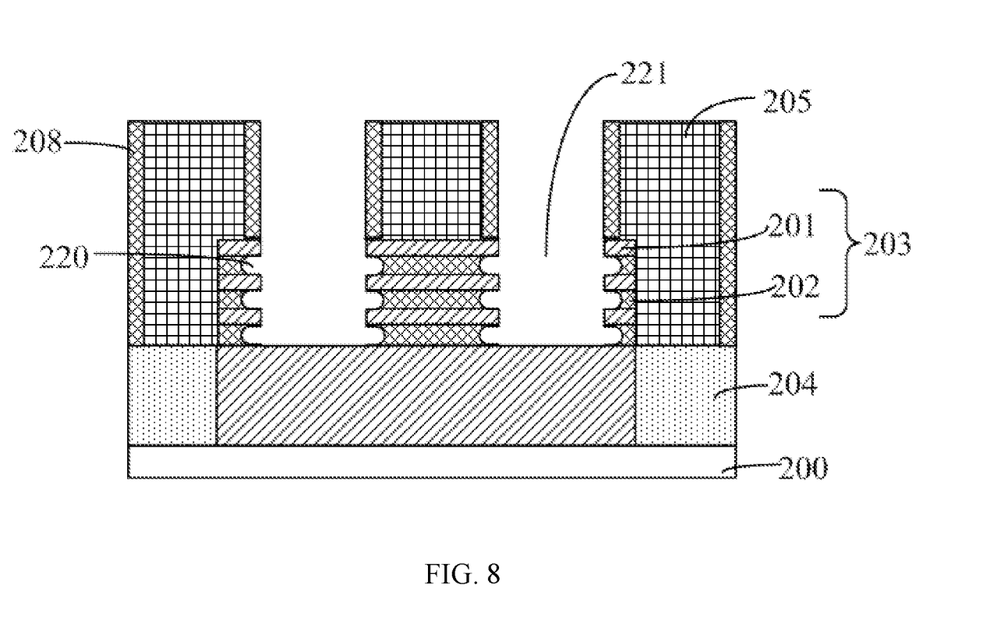

Referring to FIG. 8, the method of forming the semiconductor structure further includes removing the initial channel structures 203 on two sides of the dummy gate 205 to form source/drain gaps 221; and etching the sacrificial layers 202 on sidewalls of the source/drain gaps 221 to form initial grooves 220.

The source/drain gaps 221 provide spaces for the source/drain regions to be formed subsequently.

In one embodiment, a process of etching the sacrificial layers 202 includes an isotropic dry etching process or an isotropic wet etching process.

In the process of etching the sacrificial layers 202, the closer an area of a sacrificial layer 202 to a sidewall of a source/drain gap 221 is in direct contact with an etchant, the greater an etching rate of the sacrificial layer 202 in an etching process. Therefore, the closer a distance from a sidewall of a source/drain gap 221, the higher an etching degree of a sacrificial layer 202 is. The farther a distance from a sidewall of the source/drain gap 221 is, the slower the etching process etches the sacrificial layer 202, and the more incompletely etched the sacrificial layer 202 is. Therefore, after an etching is completed, the initial grooves 220 protrude into the sacrificial layers 202.

Figure 9:
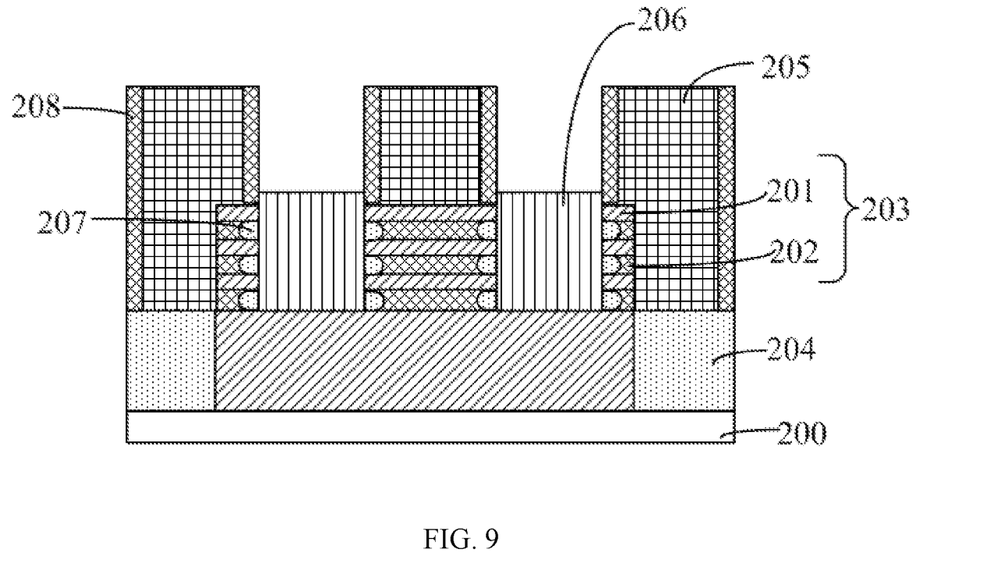

Referring to FIG. 9, the method of forming the semiconductor structure further includes forming inner spacer layers 207 in the initial grooves 220; and forming source/drain regions 206 in the source/drain gaps 221, and the inner spacer layers 207 being in contact with sidewalls of the source/drain regions 206.

The inner spacer layers 207 are configured to isolate the gates and the source/drain regions 206 to be formed in subsequence.

In one embodiment, the inner spacer layers 207 include first surfaces (not marked) facing the sacrificial layers 202. Since the initial grooves 220 protrude into the sacrificial layers 202, the first surfaces of the inner spacer layers 207 formed in the initial groove 220 also protrude into the sacrificial layers 202, and the first surfaces include edge regions adjacent to the channel layers 201 and central regions between the edge regions.

In one embodiment, a process of forming the inner spacer layers 207 includes an atomic layer deposition process.

Specifically, forming the inner spacer layers 207 in the initial grooves 220 includes: depositing initial material layers (not shown) in the initial grooves 220 and on sidewalls of the source/drain gaps 221; and etching back and removing the initial material layers on the sidewalls of the source/drain gaps 221 to form the inner spacer layers 207 within the initial grooves 220.

A material of the inner spacer layers 207 includes silicon oxynitride.

Forming the source/drain regions 206 includes a selective epitaxial growth process.

Figure 10:
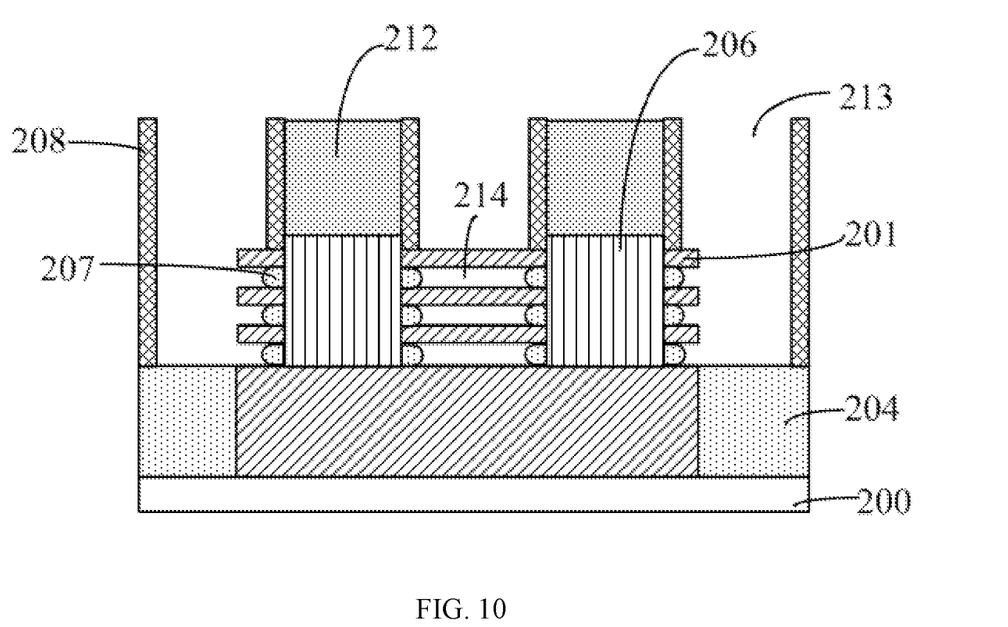

Referring to FIG. 10, the method of forming the semiconductor structure further includes forming isolation dielectric layers 212 surrounding the dummy gate 205 and the source/drain regions 206; removing the dummy gate 205 and forming gate openings 213 on the isolation dielectric layers 212; removing the sacrificial material layers 202 exposed by the gate openings 213, forming gate grooves 214 between adjacent channel layers 201, and the gate grooves 214 exposing the inner spacer layers 207.

The gate opening 213 and the gate groove 214 provide spaces for gate structures formed in subsequence, so that the gate structures formed in subsequence can surround the channel layers 201 to better reduce leakage and control current.

In one embodiment, a method for removing the sacrificial layers 202 includes a wet etching process. Since a material of the sacrificial layers 202 is different from a material of the channel layers 201 and the inner spacer layers 207, the sacrificial layers 202 can be selectively removed by selecting a suitable etchant, so that gate grooves 214 are formed between adjacent channel layers 201.

Figure 11:
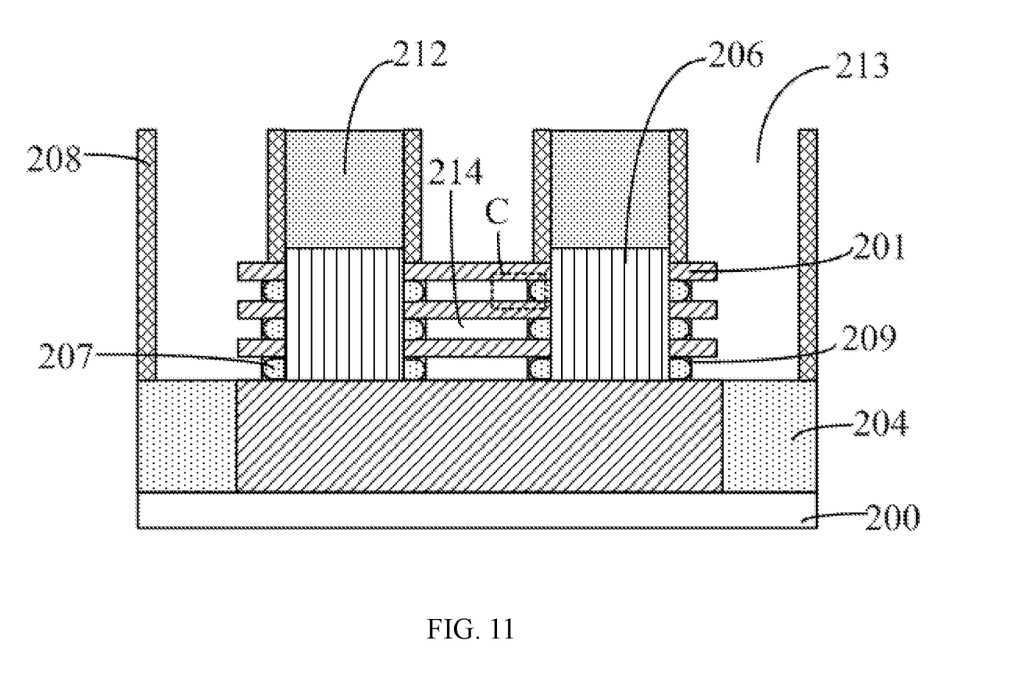
Figure 12:
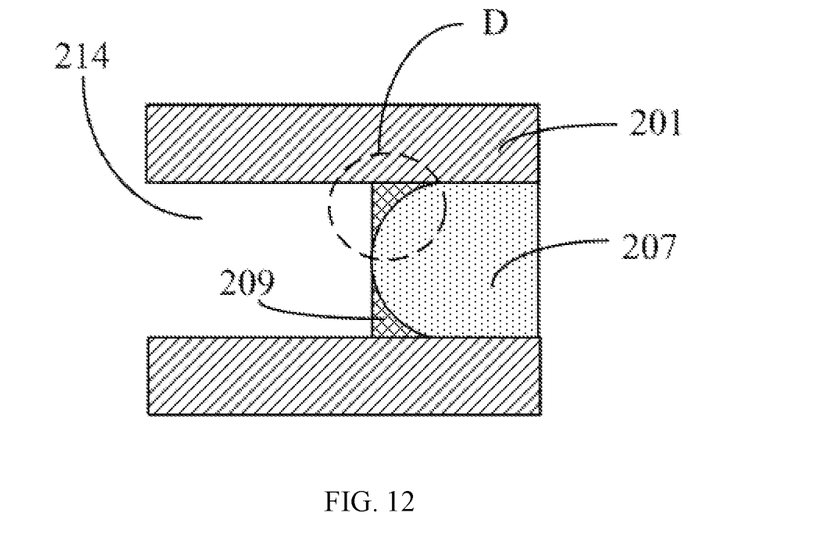

Referring to FIG. 11 and FIG. 12, FIG. 12 illustrates a partially enlarged view of area C in FIG. 11. The method of forming the semiconductor structure further includes forming first dielectric layers 209 on surfaces of the inner spacer layers 207 exposed by the gate grooves 214.

A dielectric constant of a material of first dielectric layers 209 is lower than a dielectric constant of a material of the gate dielectric layers formed in subsequence. Specifically, in one embodiment, the material of the first dielectric layers 209 is silicon oxide.

In one embodiment, the first dielectric layers 209 are on surfaces of edge regions of the inner spacer layers 207, and the first dielectric layers 209 expose surfaces of central regions of the inner spacer layers 207.

Specifically, there is a gap at a corner D formed by an edge region of an inner spacer layer 207 and a surface of a channel layer 201. An existence of the first dielectric layers 209 make the gaps be filled with a material with a lower dielectric constant, so that a dielectric constant of the entire dielectric layers in the gate grooves 214 is lower, thereby reducing parasitic capacitances between the source/drain regions 206 and the gates formed in subsequence and improving a device performance.

In one embodiment, a thickness of a first dielectric layer 209 is related to a shape of an edge region of an inner spacer layer 207. The larger a curvature of an edge region, the larger a gap at the corner D is. Therefore, thicker first dielectric layers 209 are required to fill the gaps.

Preferably, thicknesses of the first dielectric layers 209 range from 3 nanometers to 4 nanometers.

In one embodiment, only the first dielectric layers 209 on surfaces of the edge regions of the inner spacer layers 207 are reserved, and the first dielectric layers 209 exposes surfaces of the central regions of the inner spacer layers 207, thereby reducing a dielectric constant of the entire dielectric layers in the gate grooves 214 through the first dielectric layers 209, ensuring that the gate grooves 214 have enough spaces to accommodate the gate structures formed in subsequence, and guaranteeing an electrical performance of a transistor.

In one embodiment, the first dielectric layers 209 are on surfaces of the central regions and edge regions of the inner spacer layers 207. Thicknesses of the first dielectric layers 209 on surfaces of the central regions of the inner spacer layers 207 are smaller than thicknesses of the first dielectric layers on surfaces of the edge regions of the inner spacer layer 207.

Due to greater thicknesses of the first dielectric layers, a dielectric constant of the overall first dielectric layers in the gate grooves can be reduced to a greater extent, thereby further reducing parasitic capacitances between the source/drain regions and the gates formed in subsequence.

In one embodiment, the first dielectric layers may also partially fill the gaps at corners formed by the edge regions of the inner spacer layers and surfaces of the channel layers.

In one embodiment, forming the first dielectric layers 209 includes depositing first dielectric layers 209 on the surfaces of the inner spacer layers 207, surfaces of the channel layers 201 and sidewalls of the gate openings 213; and etching and removing the first dielectric layers 209 on the surfaces of the channel layers 201, the sidewalls of the gate openings 213 and the central regions of the inner spacer layers 207, so that only the first dielectric layers 209 on the edge regions of the inner spacer layers 207 remain.

Specifically, a deposition process of the first dielectric layers 209 includes an atomic layer deposition process. The atomic layer deposition process has a good surface coverage ability, and can better control thicknesses and shapes of the first dielectric layers 209, so that the first dielectric layers 209 fill the gaps at the corner D.

In one embodiment, a process of etching the first dielectric layers 209 includes an isotropic dry etching process or an isotropic wet etching process.

Since the gaps at the corner D of the surfaces of the edge regions of the inner spacer layers 207 are relatively narrow, the inner spacer layers are easily filled by the first dielectric layers 209. The central regions of the inner spacer layers 207 and sidewalls of the channel layers 201 and the gate openings 213 are relatively flat, and the first dielectric layers 209 are deposited on surfaces of the first dielectric layers 209 with relatively thin thicknesses. Therefore, an etching amount of a first dielectric layer 209 can be controlled by controlling an etching time of an etching process, so that the etching process can remove the first dielectric layers 209 on the surfaces of the central region of the inner spacer layers 207, the surfaces of the channel layers 201 and the sidewalls of the gate opening 213 and retain the edge regions of the internal spacer layers 207.

Figure 13:
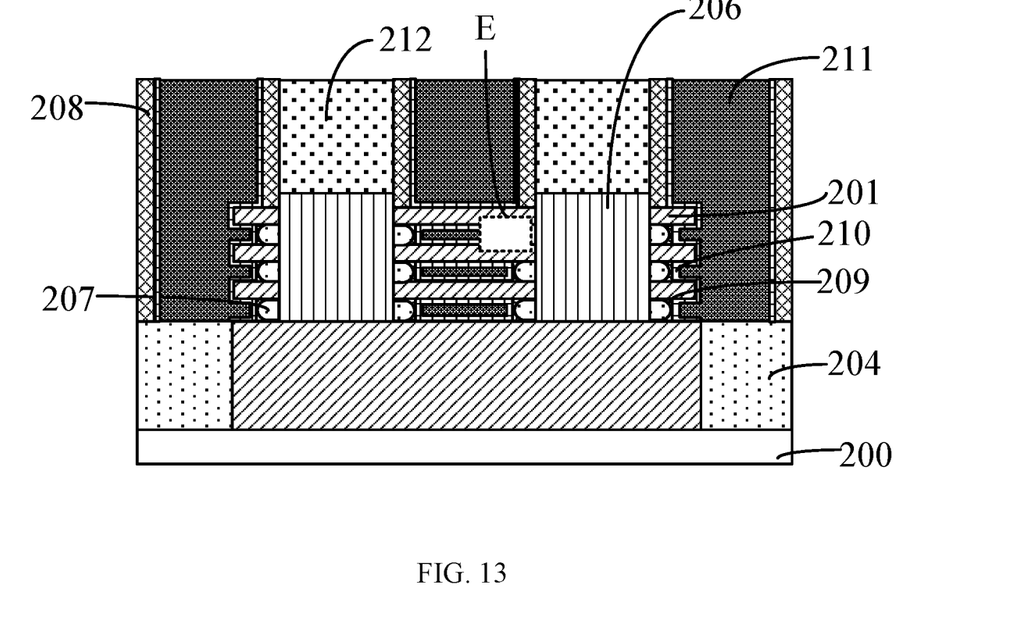
Figure 14:
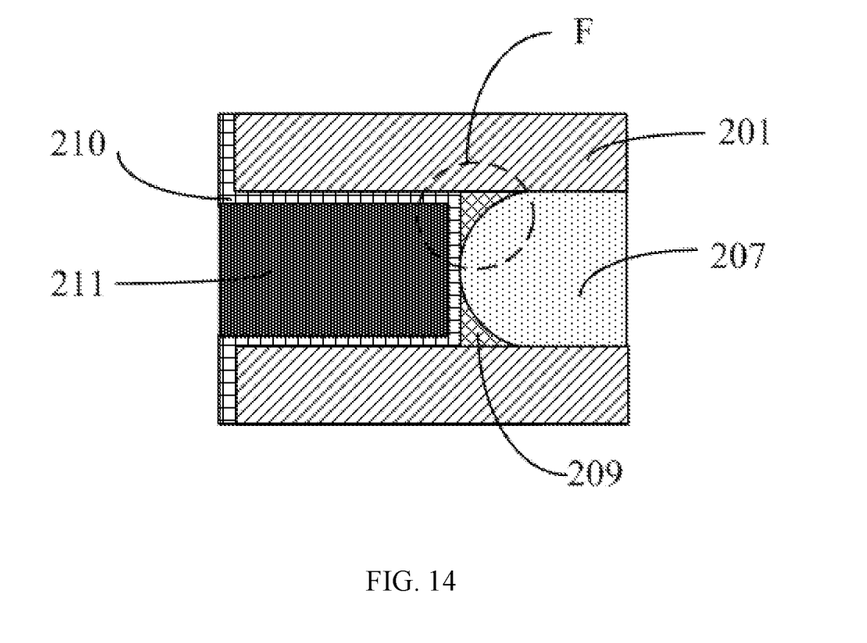

Referring to FIG. 13 and FIG. 14, FIG. 14 illustrates a partially enlarged view of an area E in FIG. 13. Gate structures (not shown) are formed in the gate grooves 214 and the gate openings 213. A gate structure includes a gate 211 and a gate dielectric layer 210 on a surface of the gate 211. A dielectric constant of a material of the first dielectric layers 209 is lower than a dielectric constant of a material of the gate dielectric layers 210.

Since the first dielectric layers 209 on the surfaces of the inner spacer layers 207 are formed, and the dielectric constant of the material of the first dielectric layers 209 is lower than the dielectric constant of the material of the gate dielectric layers 210, the first dielectric layers 209 replace the gate dielectric layers 210 to fill the gaps at a corner F formed by a surfaces of a channel layers 201 and a surface of an edge region of an inner spacer layer 207, so that a proportion of the gate dielectric layers 210 in regions between the inner spacer layers 207, the channel layers 201 and the gates 211 is reduced, a dielectric constant of the overall dielectric layers between the inner spacer layers 207, the channel layers 201 and the gates 211 is lower, thereby reducing parasitic capacitances between the source/drain regions 206 and the gates 211, reducing a device power consumption and improving a device performance.

In one embodiment, a material of the gate dielectric layers 210 includes hafnium oxide. Thicknesses of the gate dielectric layers 210 range from 1 nm to 2 nm. A process of forming the gate dielectric layer 210 includes an atomic layer deposition process.

In one embodiment, a material of the gate dielectric layers 210 includes hafnium oxide. A thickness of the gate dielectric layers 210 ranges from 1 nanometer to 2 nanometers. A process of forming the gate dielectric layers 210 includes an atomic layer deposition process.

In one embodiment, after the gate structures are formed, the gates 211 are planarized.

Since the gate structures are in the gate openings 213 and the gate grooves 214, the gate structures surround the channel layers 201 to better control current and reduce leakage. An existence of the inner spacer layers 207 separate the gate structures in the gate grooves 214 from the source/drain regions 206, thereby ensuring an electrical performance of a stacked nanosheet field effect transistor. Based on the above, the first dielectric layers 209 between the inner spacer layers 207 and the gate structures furthers reduce parasitic capacitances between the source/drain regions 206 and the gates 211, thereby forming a field effect transistor device with low power consumption and high performance.

In other embodiments, the method of forming the inner spacer layers and the first dielectric layers can also be applied to Forksheet Field-Effect Transistor or Complementary Field-Effect Transistors with a plurality of stacked channel layers, to reduce parasitic capacitance between the source/drain regions and the gates in the device and improve device performance.

Correspondingly, in one embodiment, the present disclosure also provides a semiconductor structure formed by the above method.

Referring to FIG. 13 and FIG. 14, the semiconductor structure includes a substrate 200; channel structures (not marked) on the substrate 200, a channel structure including a plurality of channel layers 201 stacked along a direction perpendicular to a surface of the substrate 200, and gate grooves (not marked) being between adjacent channel layers 201; gate structures (not marked) spanning the channel structures and being also in gate grooves, the gate structures surrounding the channel layers 201, and a gate structure including a gate 211 and a gate dielectric layer 210 on a surface of a gate 211; source/drain regions 206 on the substrate 200 on two sides of the gates 211 and the channel layers 201, the source/drain regions 206 being in contact with sidewalls of a plurality of channel layers 201; and inner spacer layers 207 between adjacent channel layers 201 and first dielectric layers 209 between the inner spacer layers 207 and the gate structures, the inner spacer layers 207 being between the source/drain regions 206 and the gate structures, and a dielectric constant of a material of the first dielectric layers 209 being lower than a dielectric constant of a material of the gate dielectric layers 210.

In one embodiment, the inner spacer layers 207 include first surfaces facing a gate grooves. The first surfaces protrude into the gate grooves, and the first surfaces include edge regions adjacent to channel layers 201 and central regions between the edge regions.

In one embodiment, the first dielectric layers 209 are on surfaces of the edge regions of the inner spacer layers 207, and the first dielectric layers 209 expose surfaces of the central regions of the inner spacer layers 207.

In one embodiment, the first dielectric layers 209 are on the surfaces of the central regions and the edge regions of the inner spacer layers 207, and thicknesses of the first dielectric layers on the surfaces of the central regions of the inner spacer layers 207 are smaller than thicknesses of the first dielectric layers on the surfaces of the edge regions of the inner spacer layers 207.

In one embodiment, thicknesses of the first dielectric layer 209 range from 3 nanometers to 4 nanometers and thicknesses of the gate dielectric layers 210 range from 1 nanometer to 2 nanometers.

In one embodiment, a material of the first dielectric layers 209 includes silicon oxide and a material of the gate dielectric layers 210 includes hafnium oxide.

In one embodiment, a gate 211 includes a work function layer (not shown) and a gate metal layer (not shown).

In one embodiment, the semiconductor structure further includes isolation structures (not shown) between the channel structures on the substrate 200.

The semiconductor structure and the method of forming the semiconductor structure provided by the present disclosure at least achieve the following beneficial effects.

In the method of forming a semiconductor structure provided by the technical solution of the present disclosure, since the first dielectric layers on the surfaces of the inner spacer layers, and a dielectric constant of a material of the first dielectric layers is lower than a dielectric constant of a material of the gate dielectric layers, a proportion of the gate dielectric layers in regions between the inner spacer layers, the channel layers and the gates is reduced, a dielectric constant of overall dielectric layers between the inner spacer layers, the channel layers and the gates is lower, thereby reducing parasitic capacitances between the source/drain regions and the gates, reducing a device power consumption, and improving a device performance.

In the semiconductor structure provided by the technical solution of the present disclosure, since a dielectric constant of a material of the first dielectric layers on the surfaces of the inner spacer layers is lower than a dielectric constant of a material of the gate dielectric layers, a dielectric constant of the entire dielectric layers between the inner spacer layers, the channel layers and the gates is lower, thereby reducing parasitic capacitances between the source/drain regions and the gates, reducing a device power consumption, and improving a device performance.

Further, since the first surfaces protrude into the gate grooves, the first surfaces includes edge regions adjacent to the channel layers and central regions between the edge regions. Large gaps are at corners formed by the edge regions and the surfaces of the channel layers, and an existence of the first dielectric layers makes the gaps be filled with a material with a lower dielectric constant, so that a dielectric constant of the entire dielectric layers between the inner spacer layers, the channel layers and the gates is lower, thereby reduces parasitic capacitances between the source/drain regions and the gates.

Although the present disclosure is disclosed above but is not limited thereto. A person skilled in the art can make various changes and modifications without departing from the spirit and scope of the present disclosure. The scope of protection of the present disclosure shall be determined by the scope defined in the claims.

What is claimed is:

1. A semiconductor structure, comprising:
a substrate;
channel structures on the substrate, a channel structure of the channel structures including a plurality of channel layers stacked along a direction perpendicular to a surface of the substrate and a plurality of gate grooves between adjacent channel layers;
gate structures spanning the channel structure, the gate structures being also in the plurality of gate grooves, the gate structures surrounding the plurality of channel layers, and a gate structure of the gate structures including a gate and a gate dielectric layer on a surface of the gate;
source/drain regions on the substrate on two sides of the gates and the channel layers, the source/drain regions being in contact with sidewalls of a plurality of channel layers; and
inner spacer layers between adjacent channel layers, and first dielectric layers between the inner spacer layers and the gate structures, and the inner spacer layers being between the source/drain regions and the gate structures, wherein an interface of an inner spacer layer with a corresponding channel layer separates a corresponding first dielectric layer from the source/drain regions.

2. The semiconductor structure according to claim 1, wherein the inner spacer layers include first surfaces facing the gate grooves, the first surfaces protrude into the gate grooves, the first surfaces include edge regions adjacent to the channel layers and center regions between the edge regions.

3. The semiconductor structure according to claim 2, wherein the first dielectric layers are on surfaces of the edge regions, and the first dielectric layers expose surfaces of the central regions such that the central regions of the inner spacer layers are in contact with the gate dielectric layers.

4. The semiconductor structure according to claim 2, wherein the first dielectric layers are on surfaces of the central regions and the edge regions, and a thickness of the first dielectric layers on the surfaces of the central regions is smaller than a thickness of the first dielectric layers on the surfaces of the edge regions.

5. The semiconductor structure according to claim 1, wherein thicknesses of the first dielectric layers range from 3 nanometers to 4 nanometers and thicknesses of the gate dielectric layers range from 1 nanometer to 2 nanometers.

6. The semiconductor structure according to claim 1, wherein a material of the first dielectric layers includes silicon oxide and a material of the gate dielectric layer includes hafnium oxide.

7. The semiconductor structure according to claim 1, wherein a gate of the gates includes a work function layer and a gate metal layer.

8. The semiconductor structure according to claim 1, further comprising isolation structures between the channel structures on the substrate.

9. A method of forming a semiconductor structure, comprising:
providing a substrate;
forming on the substrate initial channel structures, a dummy gate spanning the initial channel structures, source/drain regions on two sides of the dummy gate, and inner spacer layers, an initial channel structure of the initial channel structures including a plurality of channel layers stacked along a direction perpendicular to a surface of the substrate and a plurality of sacrificial layers between adjacent channel layers, and the inner spacer layers being between the sacrificial layers and the source/drain regions;
forming isolation dielectric layers surrounding the dummy gate and the source/drain regions;
removing the dummy gate, forming gate openings on the isolation dielectric layers;
removing the sacrificial layers exposed by the gate openings, forming gate grooves between adjacent channel layers, and the gate grooves exposing the inner spacer layers;
forming first dielectric layers on surfaces of the inner spacer layer exposed by the gate grooves; and
forming gate structures in the gate grooves and the gate openings after forming the first dielectric layers, a gate structure of the gate structures including a gate and a gate dielectric layer on a surface of a gate, and a dielectric constant of a material of the first dielectric layers being lower than a dielectric constant of a material of the gate dielectric layers.

10. The method according to claim 9, wherein forming the first dielectric layers includes depositing first dielectric layers on surfaces of the inner spacer layers, surfaces of the channel layers, and sidewalls of the gate openings.

11. The method according to claim 10, wherein a deposition process of the first dielectric layers includes an atomic layer deposition process.

12. The method according to claim 10, further comprising etching and removing the first dielectric layers on the surfaces of the channel layers, the sidewalls of the gate openings and part of the surfaces of the inner spacer layers after forming the first dielectric layers.

13. The method according to claim 12, wherein a process of etching the first dielectric layers includes an isotropic dry etching process or an isotropic wet etching process.

14. The method according to claim 9, wherein a method for forming the initial channel structures, the dummy gate, the source/drain regions and the inner spacer layers includes:
forming the initial channel structures on the substrate;
forming the dummy gate spanning the initial channel structures on the substrate;
removing the initial channel structures on two sides of the dummy gate to form source/drain gaps; forming inner spacer layers on sidewalls of the source/drain gaps; and
forming source/drain regions in the source/drain gaps.

15. The method according to claim 14, wherein forming the inner spacer layers includes: etching the sacrificial layers on the sidewalls of the source/drain gaps to form initial grooves; and forming inner spacer layers in the initial grooves.

16. The method according to claim 15, wherein a process of etching the sacrificial layers includes an isotropic dry etching process or an isotropic wet etching process.

17. The method according to claim 15, wherein a process of forming the inner spacer layers includes an atomic layer deposition process.

18. The method according to claim 9, wherein a process of forming the gate dielectric layers includes an atomic layer deposition process.

19. The method according to claim 9, wherein the inner spacer layers include first surfaces facing the gate grooves, the first surfaces protrude into the gate grooves, the first surfaces include edge regions adjacent to the channel layers and center regions between the edge regions.

20. The method according to claim 9, wherein the first dielectric layers are on surfaces of the edge regions, and the first dielectric layers expose surfaces of the central region.

\* \* \* \* \*